US006833312B2

(12) United States Patent
Yanagita et al.

(10) Patent No.: US 6,833,312 B2
(45) Date of Patent: Dec. 21, 2004

(54) PLATE MEMBER SEPARATING APPARATUS AND METHOD

(75) Inventors: Kazutaka Yanagita, Kanagawa (JP);
Mitsuharu Kohda, Kanagawa (JP);
Kiyofumi Sakaguchi, Kanagawa (JP);
Akira Fujimoto, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 64 days.

(21) Appl. No.: 10/152,830

(22) Filed: May 23, 2002

(65) Prior Publication Data

US 2002/0174959 A1 Nov. 28, 2002

(30) Foreign Application Priority Data

May 25, 2001 (JP) .......................... 2001-157934

(51) Int. Cl.$^7$ .......................... H01L 21/30; H01L 21/46
(52) U.S. Cl. .......................... 438/459; 438/460; 438/461; 438/464; 156/344; 156/345.1; 156/529; 156/584
(58) Field of Search .......................... 438/455–459, 438/460–465; 156/344, 345, 584, 529

(56) References Cited

U.S. PATENT DOCUMENTS

| 2,191,513 A | 2/1940 | Bigelow .......................... 141/7 |
| 2,517,394 A | 8/1950 | Le Tellier .......................... 134/89 |

(List continued on next page.)

FOREIGN PATENT DOCUMENTS

| EP | 0709876 | 5/1996 |
| EP | 0840381 | 5/1998 |
| EP | 0843345 | 5/1998 |
| EP | 0867917 | 9/1998 |
| EP | 0926719 | 6/1999 |
| EP | 0999578 | 5/2000 |
| EP | 1026729 | 8/2000 |
| EP | 1045448 | 10/2000 |
| JP | 60-005530 | 1/1985 |
| JP | 5-211128 | 9/1992 |
| JP | 04-293236 | 10/1992 |
| JP | 05-021338 | 1/1993 |
| JP | 07-302889 | 11/1995 |
| JP | 9-181026 | 7/1997 |
| JP | 2000-77286 | 2/1998 |
| JP | 11-045840 | 2/1999 |
| KR | 1998-33377 | 7/1998 |
| WO | WO 99/06110 | 2/1999 |
| WO | WO 01/04933 | 1/2001 |
| WO | WO 01/-10644 | 2/2001 |

OTHER PUBLICATIONS

"Single–Crystal Silicon on Non–Single–Crystal Insulators", G.W. Cullen, Journal of Crystal Growth, vol. 63, No. 3, pp. 429–590 (1983).

(List continued on next page.)

*Primary Examiner*—Matthew Smith
*Assistant Examiner*—Granvill D. Lee, Jr.
(74) *Attorney, Agent, or Firm*—Fitzpatrick, Cella, Harper & Scinto

(57) ABSTRACT

This invention is to support a plate member such as a bonded substrate stack in a horizontal state without coming into contact with one surface of the member and also to efficiently progress separation. Separation is executed while arranging a bonded substrate stack (50) generated by bonding a seed substrate (10) to a handle substrate (20) such that the seed substrate (10) remains on the lower side. At the first stage, the peripheral portion is separated while causing a first substrate support section (101) to chuck and support the central portion of the lower surface of the bonded substrate stack (50). Then, at the second stage, the central portion is separated while causing a second substrate support section (102) to support the lower peripheral portion and side of the bonded substrate stack (50).

19 Claims, 8 Drawing Sheets

U.S. PATENT DOCUMENTS

| | | | |
|---|---|---|---|
| 3,094,207 A | 6/1963 | Millhiser et al. | 198/209 |
| 3,489,608 A | 1/1970 | Jacobs et al. | 134/25 |
| 3,493,155 A | 2/1970 | Litant et al. | 225/2 |
| 3,549,446 A | 12/1970 | Bennett et al. | 156/230 |
| 3,549,466 A | 12/1970 | Kay et al. | 161/39 |
| 3,667,661 A | 6/1972 | Farmer | 225/2 |
| 3,730,410 A | 5/1973 | Altshuler | 225/96.5 |
| 3,970,471 A | 7/1976 | Bankes et al. | 134/6 |
| 4,047,973 A | 9/1977 | Williams | 134/10 |
| 4,208,760 A | 6/1980 | Dexter et al. | 15/302 |
| 4,215,928 A | 8/1980 | Bayley et al. | 354/319 |
| 4,850,381 A | 7/1989 | Moe et al. | 134/62 |
| 4,899,581 A * | 2/1990 | Allen et al. | 73/150 |
| 4,962,879 A | 10/1990 | Goesele et al. | 228/116 |
| 5,100,494 A * | 3/1992 | Schmidt | 156/344 |
| 5,100,544 A | 3/1992 | Izutani et al. | 210/175 |
| 5,248,886 A | 9/1993 | Asakawa et al. | 250/442.11 |
| 5,255,853 A | 10/1993 | Munoz | 239/433 |
| 5,357,645 A | 10/1994 | Onodera | 15/97.1 |
| 5,371,037 A | 12/1994 | Yonehara | 437/86 |
| 5,374,564 A | 12/1994 | Bruel | 437/24 |
| 5,379,235 A | 1/1995 | Fisher et al. | 364/508 |
| 5,482,501 A | 1/1996 | Frits | 452/125 |
| 5,492,469 A | 2/1996 | Oda et al. | 431/266 |
| 5,510,019 A | 4/1996 | Yabumoto et al. | 210/137 |
| 5,653,247 A | 8/1997 | Murakami | 134/80 |
| 5,679,405 A | 10/1997 | Thomas et al. | 427/248.1 |
| 5,724,803 A | 3/1998 | Pea | 59/78.1 |
| 5,741,805 A | 4/1998 | Acharya | 514/397 |
| 5,747,387 A | 5/1998 | Koizumui et al. | 438/708 |
| 5,783,022 A | 7/1998 | Cha et al. | 156/344 |
| 5,792,709 A | 8/1998 | Robinson et al. | 438/692 |
| 5,795,401 A | 8/1998 | Itoh et al. | 134/6 |
| 5,810,028 A | 9/1998 | Ichikawa et al. | 134/66 |
| 5,820,329 A | 10/1998 | Derbinski et al. | 414/225 |
| 5,849,602 A | 12/1998 | Okamura et al. | 438/5 |
| 5,876,497 A | 3/1999 | Atoji | 117/85 |
| 5,928,389 A | 7/1999 | Jevtic | 29/25.01 |
| 5,934,856 A | 8/1999 | Asakawa et al. | 414/217 |
| 5,954,888 A | 9/1999 | Gupta et al. | 134/3 |
| 5,994,207 A | 11/1999 | Henley et al. | 438/515 |
| 6,007,675 A | 12/1999 | Toshima | 156/345 |
| 6,054,363 A * | 4/2000 | Sakaguchi et al. | 438/406 |
| 6,071,795 A * | 6/2000 | Cheung et al. | 438/458 |
| 6,122,566 A | 9/2000 | Nguyen et al. | 700/218 |
| 6,168,499 B1 | 1/2001 | Jang | 451/8 |
| 6,221,740 B1 | 4/2001 | Bryan et al. | 438/458 |
| 6,274,224 B1 * | 8/2001 | O'Bryan et al. | 428/209 |
| 6,277,234 B1 | 8/2001 | Freund et al. | 156/344 |
| 6,321,134 B1 | 11/2001 | Henley et al. | 700/121 |
| 6,513,564 B2 * | 2/2003 | Bryan et al. | 156/584 |
| 6,527,031 B1 | 3/2003 | Yanagita et al. | 156/584 |
| 6,629,539 B1 | 10/2003 | Yanagita et al. | 134/78 |
| 6,672,031 B2 | 1/2004 | Yanagita et al. | 156/584 |
| 2003/0116275 A1 | 6/2003 | Yanagita et al. | 156/344 |
| 2004/0045679 A1 | 3/2004 | Yanagita et al. | 156/584 |

OTHER PUBLICATIONS

"Crystalline Quality of Silicon Layer Formed by FIPOS Technology", Kazuo IMAI et al., Journal of Crystal Growth, vol. 63, pp. 547–553 (1987).

"Silicon–on–Insulator by Wafer Bonding: A Review", W.P. Maszara, Journal of Electrochemical Society, vol., 138, pp. 341–347 (1991).

"Light Scattering Topography Charachterization of Bonded SOI Wafer", H. Baumgart, t al., Extended Abstracts, vol. 91–2, pp. 733–734 (1991).

"Thinning of Bonded Wafer: Etch–Stop Approaches", Charles E. Hunt et al., Extended Abstracts, vol. 91–2, pp. 696–697 (1991).

"Expitaxial Layer Transfer by Bond and Etch Back of Porous Si", Takao Yonehara et al., Applied Physics Letters, vol. 64, No. 64 pp. 2108–2110 (1994).

"Electrolytic Shaping of Germanium and Silicon", A. Uhlir et al., Bell System Technical Journal, vol. 35, pp. 333–347, (1956).

"Oxidized Porous Silicon and It's Application", K. Nagano et al., The Transactions of the Institute of Electronics and Communication Engineers, The Institute of Electronics, Information and Communication Engineers, vol. 79, pp. 49–54, SSD 79–9549 (1979).

"A New Dielectric Isolation Method Using Porous Silicon", K. Imai, Solid–State Electronics, vol. 224, pp. 159–164 (1981).

"Silicon on Insulator Material by Wafer Bonding", Christine Harendt, Charles E. Hunt t al., Journal of Electronic Materials, vol. 20, pp. 267–277 (1991).

"Smart–Cut: A New Silicon On Insulator Material Technology Based on Hydrogen Implantation and Wafer Bonding", Michael Bruel, et al., Jpn. J. Appl. Phys. vol. 36, No. 3B, Part 01, pp. 1636–1641 (Mar. 1, 1997).

* cited by examiner

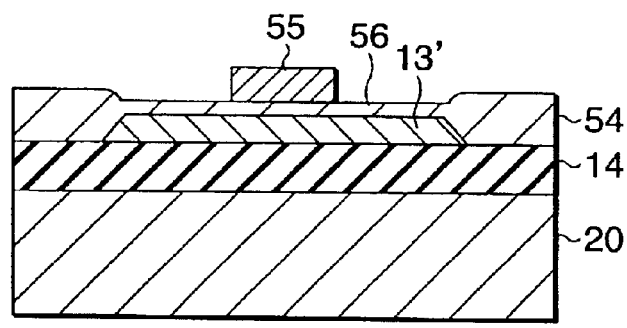
F I G. 7A
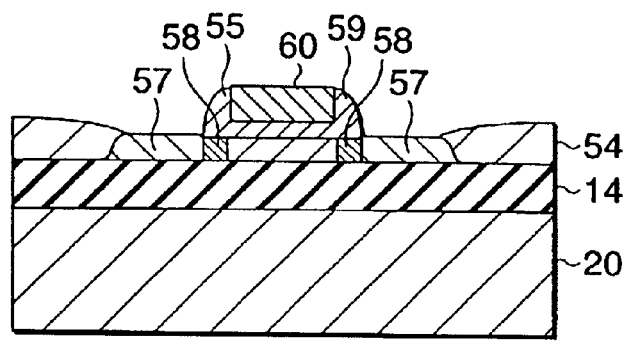
F I G. 7B
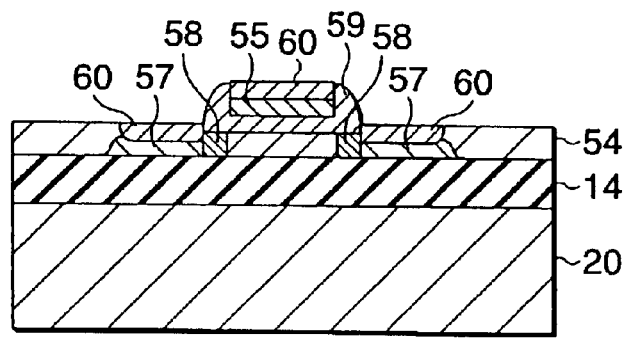
F I G. 7C
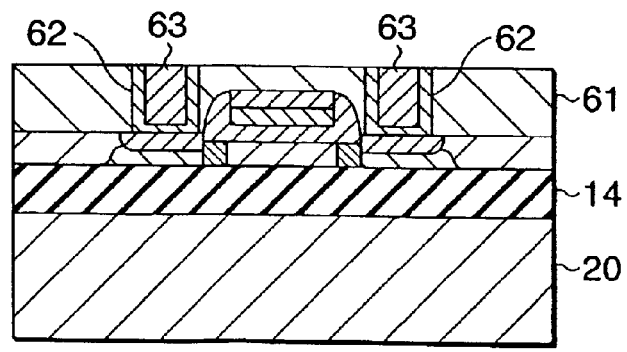
F I G. 7D

PLATE MEMBER SEPARATING APPARATUS AND METHOD

FIELD OF THE INVENTION

The present invention relates to a method and apparatus for separating a plate member such as a bonded substrate stack, a semiconductor substrate manufacturing method, and a semiconductor device manufacturing method.

BACKGROUND OF THE INVENTION

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A complete depletion type field effect transistor can be formed by thin film formation.

Since an SOI structure has the above various advantages, researches have been made on its formation method for several decades.

As a method, an SOI structure is formed by bonding a single-crystal Si substrate to another thermally oxidized single-crystal Si substrate by annealing or an adhesive. In this method, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, in thinning to the submicron order, the variation range is several ten %. As the wafer size becomes large, this difficulty becomes more pronounced.

The present applicant has disclosed a new SOI technique in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-μm thick SOI films can be manufactured by a single manufacturing apparatus.

To separate the bonded substrate stack into two substrates without breaking the first and second substrates, the following methods are available: the two substrates are pulled in opposite directions while applying a force in a direction perpendicular to the bonding interface; a shearing force is applied parallel to the bonding interface (for example, the two substrates are moved in opposite directions in a plane parallel to the bonding interface, or the two substrates are rotated in opposite directions while applying a force in the circumferential direction); pressure is applied in a direction perpendicular to the bonding interface; a wave energy such as an ultrasonic wave is applied to the separation region; a peeling member (e.g., a sharp blade such as a knife) is inserted into the separation region parallel to the bonding interface from the side surface side of the bonded substrate stack; the expansion energy of a substance filling the pores of the porous layer functioning as the separation region is used; the porous layer functioning as the separation region is thermally oxidized from the side surface of the bonded substrate stack to expand the volume of the porous layer and separate the substrates; and the porous layer functioning as the separation region is selectively etched from the side surface of the bonded substrate stack to separate the substrates.

As a bonded substrate stack separating method, the present applicant has disclosed an epoch-making technique in Japanese Patent Laid-Open No. 11-45840 (Japanese Patent No. 2877800). In the separating method described in Japanese Patent Laid-Open No. 11-45840, a fluid is injected to the side surface of a bonded substrate stack having a porous layer, thereby separating the bonded substrate stack into two substrates.

More specifically, in the separating method described in Japanese Patent Laid-Open No. 11-45840, for example, a bonded substrate stack is held by a pair of holders (substrate holding sections) each having a diameter smaller than that of the bonded substrate stack. A fluid is injected to the side surface of the bonded substrate stack while rotating it, thereby separating the bonded substrate stack into two substrates at the porous layer.

The present applicant has also disclosed in Japanese Patent Laid-Open No. 2000-077286 an improved technique of the separating method described in Japanese Patent Laid-Open No. 11-45840. The separating method described in Japanese Patent Laid-Open No. 2000-077286 separates a bonded substrate stack that is sandwiched from the sides and supported by a pair of support sections. In this separating method, a support region where the bonded substrate stack is sandwiched from the sides and supported by the pair of support sections is changed halfway during separation processing. With this change in bonded substrate stack support region, a region other than the region where separation is progressing is supported by the pair of support sections. According to this method, since the progress of separation is not influenced by the pair of support sections, separation progresses at high efficiency and reproducibility.

However, when the substrate is sandwiched from the sides and supported, supported portions may be soiled or damaged.

In addition, as semiconductor devices are micropatterned or highly integrated, a new requirement is arising for substrates such as SOI substrates. Conventionally, only the upper surfaces of substrates such as SOI substrates are regarded as important. The requirement for their lower surface state is relatively lenient. However, along with an increase in micropatterning and integration degrees of semiconductor devices, damages to the lower surfaces of substrates come into question. If the lower surface is damaged, a given planarity of the substrate is not ensured when the substrate is placed on the wafer stage of, e.g., an exposure apparatus and subjected to exposure. Hence, it is difficult to accurately transfer a fine pattern.

SUMMARY OF THE INVENTION

The present invention has been made in consideration of the above situation, and has as its object to support a plate member such as a bonded substrate stack without coming into contact with one surface of the member and also to efficiently progress separation.

According to the first aspect of the present invention, there is provided a separating apparatus for separating a plate member having a separation layer at the separation layer while horizontally supporting the plate member, comprising an ejection section which ejects a fluid toward a recess portion on an outer side of the plate member so as to separate the plate member at the separation layer, a first support section which comes into contact with a first region that is a central portion of a lower surface of the plate member to support the plate member without coming into contact with an upper surface of the plate member, a second support section which comes into contact with only a second region of the plate member except the central portion of the lower surface of the plate member and the upper surface of the plate member to support the plate member while regulating a horizontal position of the plate member, and a control section which causes the first support section to support the plate member at a first stage of separation processing of the plate member and causes the second support section to support the plate member at a second stage of the separation processing, wherein the separation processing is executed in a state in which a space is ensured on the upper surface of the plate member.

According to a preferred aspect of the present invention, the second region is, e.g., an edge portion of the plate member. In addition, the state in which the space is ensured on the upper surface of the plate member is, e.g., a state in which the upper surface of the plate member is not in contact with any support member.

According to a preferred aspect of the present invention, this separating apparatus preferably further comprises a rotating mechanism which rotates the plate member in a horizontal plane by rotating the first support section.

According to a preferred aspect of the present invention, the second support section preferably supports the plate member in a stationary state.

According to a preferred aspect of the present invention, preferably, this separating apparatus further comprises a driving mechanism which moves at least one of the first support section and the second support section, and at transition from the first stage to the second stage of the separation processing, the control section causes the driving mechanism to operate, thereby causing the second support section to support the plate member that has been supported by the first support section.

According to a preferred aspect of the present invention, this separating apparatus preferably further comprises a position adjustment mechanism which adjusts a position of the ejection section so that the fluid ejected from the ejection section is injected into the separation layer of the plate member.

According to a preferred aspect of the present invention, the plate member has, e.g., a disk shape.

According to a preferred aspect of the present invention, the separation layer is formed by, e.g., anodizing or ion implantation.

According to the second aspect of the present invention, there is provided a separating method of separating a bonded substrate stack, formed by bonding a seed substrate having a separation layer and a transfer layer on the separation layer to a handle substrate, into two substrates at the separation layer, wherein the first support section of the separating apparatus according to the first aspect of the present invention is caused to support the bonded substrate stack while keeping the handle substrate on an upper side, and the bonded substrate stack is separated into two substrates at the portion of the separation layer by the separating apparatus.

According to the third aspect of the present invention, there is provided a separating method of separating a plate member having a separation layer at the separation layer by injecting a fluid into the separation layer while horizontally supporting the plate member, comprising the first step of, in a state in which a space is ensured on an upper surface of the plate member having a recess portion on an outer side, supporting the plate member while coming into contact with a first region that is a central portion of a lower surface of the plate member and without coming into contact with the upper surface of the plate member, and the second step of, in the state in which the space is ensured on the upper surface of the plate member, supporting the plate member while coming into contact with only a second region of the plate member except the central portion of the lower surface of the plate member and the upper surface of the plate member, and regulating a horizontal position of the plate member.

According to a preferred aspect of the present invention, the second region is, e.g., an edge portion of the plate member. In addition, the state in which the space is ensured on the upper surface of the plate member is, e.g., a state in which the upper surface of the plate member is not in contact with any support member.

According to a preferred aspect of the present invention, in the first step, preferably, a peripheral portion of the plate member is separated at the portion of the separation layer by injecting the fluid into the separation layer of the plate member while rotating the plate member in a horizontal plane.

According to a preferred aspect of the present invention, in the second step, preferably, a central portion of the plate member is separated at the portion of the separation layer while supporting the plate member in a stationary state.

According to a preferred aspect of the present invention, the plate member has, e.g., a disk shape.

According to a preferred aspect of the present invention, the separation layer is formed by, e.g., anodizing or ion implantation.

According to a preferred aspect of the present invention, preferably, the plate member is a bonded substrate stack generated by bonding a seed substrate having a separation layer and a transfer layer on the separation layer to a handle substrate, and in the first and second steps, the bonded substrate stack is supported while keeping the handle substrate on an upper side.

According to the fourth aspect of the present invention, there is provided a semiconductor substrate manufacturing method comprising the steps of generating a bonded substrate stack as a plate member by bonding a seed substrate having a separation layer and a transfer layer on the separation layer to a handle substrate, and in a state in which the bonded substrate stack is horizontally supported while keeping the handle substrate on the upper side, separating the bonded substrate stack into two substrates at a portion of the separation layer by applying the separating method according to the third aspect of the present invention.

According to the fifth aspect of the present invention, there is provided a semiconductor device manufacturing method comprising the steps of preparing an SOI substrate manufactured by applying the manufacturing method according to the fourth aspect of the present invention, and element-isolating an SOI layer of the SOI substrate and forming a transistor on the element-isolated SOI layer.

According to a preferred aspect of the present invention, the transistor is a partially depleted FET or a fully depleted FET.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 7A to 7D are sectional views showing a method of manufacturing a semiconductor device using a semiconductor substrate that can be manufactured by the substrate manufacturing method according to the preferred embodiment of the present invention.

DETAILED DESCRIPTION OF THE PREFERRED EMBODIMENTS

Preferred embodiments of the present invention will be described below with reference to the accompanying drawings.

FIGS. 1A to 1E are schematic views for explaining a method of manufacturing a substrate having, e.g., an SOI structure according to a preferred embodiment of the present invention.

Figure 1A:
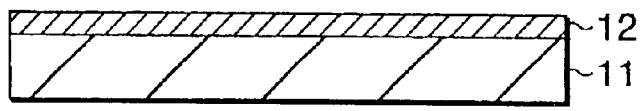
FIGS. 1A to 1E are schematic views for explaining the step of forming a porous layer in a substrate manufacturing method according to a preferred embodiment of the present invention.

In the step shown in FIG. 1A, a single-crystal Si substrate 11 to be used to form a first substrate (seed wafer) 10 is prepared, and a porous Si layer 12 serving as a separation layer is formed on the major surface of the single-crystal Si substrate 11. The porous Si layer 12 can be formed by, e.g., anodizing the single-crystal Si substrate 11 in an electrolyte solution (anodizing solution).

As the electrolyte solution, for example, a solution containing hydrogen fluoride, a solution containing hydrogen fluoride and ethanol, a solution containing hydrogen fluoride and isopropyl alcohol, or the like can be used. More specifically, as the electrolyte solution, for example, a solution mixture containing an HF aqueous solution (HF concentration=49 wt %) and ethanol at a volume ratio of 2:1 can be used.

The porous Si layer 12 may have a multilayered structure including two or more layers with different porosities. The porous Si layer 12 having a multilayered structure preferably includes a first porous Si layer with a first porosity on the upper surface side, and, under the first porous Si layer, a second porous Si layer with a second porosity higher than the first porosity. With such a multilayered structure, a non-porous layer 13 free from defects can be formed on the first porous Si layer in the step of forming the non-porous layer 13 later, and a bonded substrate stack can be separated at a desired position in the separation step later. The first porosity is preferably 10% to 30% and, more preferably, 15% to 25%. The second porosity is preferably 35% to 70% and, more preferably, 40% to 60%.

When the above solution mixture (49 wt % hydrofluoric acid: ethanol=2:1) is used as the electrolyte solution, preferably, for example, the first layer (surface side) is formed at a current density of 8 mA/cm$^2$ for a process time of 5 to 11 min, and the second layer (inner surface side) is formed at a current density of 23 to 33 mA/cm$^2$ for a process time of 80 sec to 2 min.

Next, at least one of the following steps (1) to (4) is preferably executed. The steps (1) and (2) are preferably executed in this order. More preferably, the steps (1), (2), and (3), or (1), (2), and (4) are executed in this order. Most preferably, the steps (1), (2), (3), and (4) are executed in this order.

(1) Step of Forming Protective Film on Porous Walls in Porous Si Layer (Pre-oxidation Step)

In this step, a protective film such as an oxide film or nitride film is formed on the porous walls in the porous Si layer 12, thereby preventing any increase in porous size by subsequent annealing. The protective film can be formed by performing annealing in an oxygen atmosphere (preferably at, e.g., 200° C. to 700° C., and more preferably at 300° C. to 500° C.). After that, the oxide film or the like formed on the surface of the porous Si layer 12 is preferably removed. This can be done by, e.g., exposing the surface of the porous Si layer 12 to a solution containing hydrofluoric acid.

(2) Hydrogen Baking Step (Pre-baking Step)

In this step, a first substrate 10 on which a porous Si layer 12 is formed is annealed in a reduction atmosphere containing hydrogen at 800° C. to 1,200° C. With this annealing, pores on the surface of the porous Si layer 12 can be sealed to some extent. If a native oxide film is present on the surface of the porous Si layer 12, it can be removed.

(3) Trace Material Supply Step (Pre-injection Step)

When a non-porous layer 13 is to be grown on the porous Si layer 12, it is preferably grown at a low speed by supplying a trace amount of raw material substance of the non-porous layer 13 at the initial stage of growth. With this growing method, atomic migration on the surface of the porous Si layer 12 is promoted, and pores on the surface of this porous Si layer 12 can be sealed. More specifically, the supply of the raw material is controlled such that the growth rate becomes 20 nm/min or less, preferably 10 nm/min or less, and more preferably, 2 nm/min or less.

(4) High-Temperature Baking Step (Intermediate Baking Step)

When annealing is executed in a reduction atmosphere containing hydrogen at a temperature higher than that in the above hydrogen baking step and/or trace material supply step, further sealing and flattening of the porous Si layer 12 can be realized.

Figure 1B:
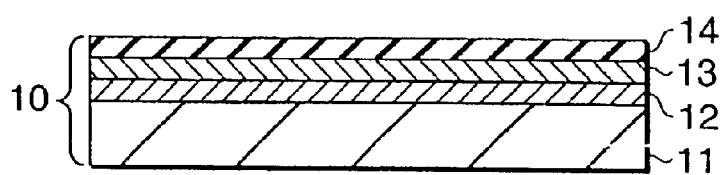

At the first stage of the step shown in FIG. 1B, a first non-porous layer 13 is formed on the porous Si layer 12. As the first non-porous layer 13, an Si layer such as a single-crystal Si layer, poly-Si layer, or amorphous Si layer, Ge layer, SiGe layer, SiC layer, C layer, GaAs layer, GaN layer, AlGaAs layer, InGaAs layer, InP layer, or InAs layer can be used.

At the second stage of the step shown in FIG. 1B, an $SiO_2$ layer (insulating layer) 14 serving as the second non-porous layer is formed on the first non-porous layer 13. With this process, the first substrate 10 is obtained. The $SiO_2$ layer 14 can be formed, e.g., in an $O_2/H_2$ atmosphere at 1,100° C. for 10 to 33 min.

Figure 1C:
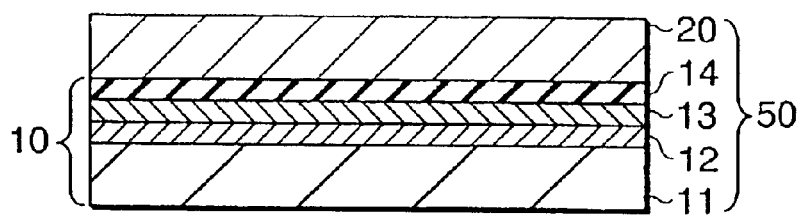

In the step shown in FIG. 1C, a second substrate (handle wafer) 20 is prepared and brought into tight contact with the first substrate 10 at room temperature while making the insulating layer 14 face the second substrate 20, thereby forming a bonded substrate stack 30.

The $SiO_2$ layer 14 can be formed either on the single-crystal Si layer 13 side, or on the second substrate 20, or on both the single-crystal Si layer 13 and the second substrate 20 as long as the state shown in FIG. 1C is obtained when the first and second substrates are brought into tight contact with each other. However, when the insulating layer 14 is formed on the first non-porous layer (e.g., a single-crystal Si layer) 13 side serving as an active layer, as described above, the bonding interface between the first substrate 10 and the second substrate 20 can be separated from the active layer, and a semiconductor substrate such as an SOI substrate with a higher quality can be obtained.

After the substrates 10 and 20 are completely brought into tight contact, processing of strengthening bonding between the substrates is preferably executed. As an example of this processing, processing of, e.g., 1) executing annealing in an $N_2$ atmosphere at 1,100° C. for 10 min and 2) executing annealing (oxidation) in an $O_2/H_2$ atmosphere at 1,100° C. for 50 to 100 min is preferably performed. In addition to this processing, or in place of this processing, anodic bonding and/or compression may be executed.

As the second substrate 20, an Si substrate, a substrate obtained by forming an $SiO_2$ layer on an Si substrate, a transparent substrate such as a silica substrate, or a sapphire substrate can be used. However, any other substrate may be used because the second substrate 20 only needs to have a sufficiently flat surface to be bonded.

Figure 1D:
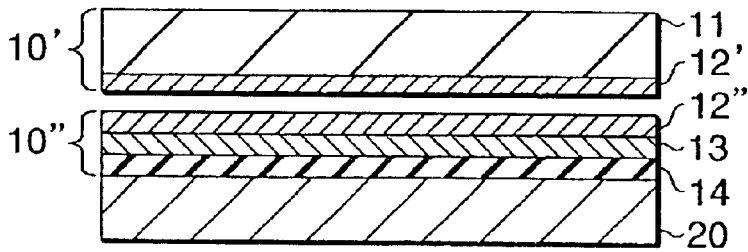

In the step shown in FIG. 1D, the bonded substrate stack 30 is separated at the fragile porous Si layer 12 having a low mechanical strength by the separating method (to be described later). FIG. 1D illustrates the separation as if it occurred in the separation layer. However, separation may sometimes occur at the interface between the porous Si layer 12 and the non-porous layer 13 and/or at the interface between the single-crystal Si substrate 11 and the porous Si layer 12. It is also preferable to separate the bonded substrate stack almost at the interface between the porous Si layer 12 and non-porous layer 13 by controlling the layer structure of the separation layer.

Figure 1E:
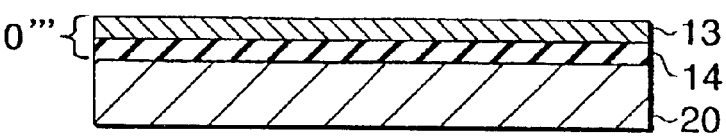

In the step shown in FIG. 1E, a porous layer 12" on the non-porous layer 13 after separation is selectively removed by etching or the like.

Also, a porous layer 12' on the single-crystal Si substrate 11 of a first substrate 10' after separation is selectively removed by etching or the like. The thus obtained single-crystal Si substrate 11 can be reused as a substrate for forming the first substrate 10 or as the second substrate 20 again.

As a bonded substrate stack, a substrate prepared by the following method may be employed. First, a semiconductor substrate represented by a single-crystal Si substrate such as a mirror wafer or epitaxial wafer is prepared. An insulating film such as a thermal silicon oxide film is formed on the surface of the substrate, as needed. Next, ions such as hydrogen ions or rare gas ions are implanted into the substrate by ion implantation using a line beam or plasma immersion, thereby forming a relatively heavily doped ion implantation layer serving as a separation layer at a predetermined depth from the surface. The first substrate is obtained in the above manner. Note that a method of manufacturing an SOI substrate using an ion implantation layer formed by implanting hydrogen ions is described in, e.g., Japanese Patent Laid-Open No. 5-211128.

Next, the second substrate is prepared according to the same procedure as described above and bonded to the first substrate in accordance with the above-described bonding method. With this process, a bonded substrate stack having a layer to be transferred (transfer layer) inside can be obtained.

The ion implantation layer is distorted or contains defects or pores formed from microcavities due to the implanted ions. Such an ion implantation layer has a relatively low mechanical strength and therefore functions as a separation layer.

A separating method and apparatus according to the preferred embodiment of the present invention, which can be applied to the separation step shown in FIG. 1D, will be described next. The separating apparatus according to the preferred embodiment of the present invention is useful for separating a bonded substrate stack (an example of a plate member) having a separation layer such as a porous layer formed by anodizing or an ion implantation layer formed by ion implantation into two substrates at the portion of the separation layer.

This separating apparatus comprises an ejection section (nozzle) which ejects a fluid to separate a bonded substrate stack 50 into two substrates at the porous layer 12 serving as a separation layer, a first substrate support section which comes into contact with only the central portion (first region) of the lower surface of the bonded substrate stack 50 to horizontally support the bonded substrate stack 50, and a second substrate support section which comes into contact with only a region (second region) except the central portion of the lower surface of the bonded substrate stack 50 and the upper surface of the bonded substrate stack to horizontally support the bonded substrate stack 50 while regulating the horizontal position of the bonded substrate stack 50.

The bonded substrate stack 50 is handled while keeping its first substrate (seed substrate or seed wafer) 10 on the lower side and the second substrate (handle substrate or handle wafer) 20 on the upper side. The second substrate (handle substrate or handle wafer) 20 is separated from the first substrate 10 and then serves an SOI substrate after predetermined processing, as described with reference to FIGS. 1A to 1E. As described above, a substrate such as an SOI substrate preferably has no damages and the like not only on its upper surface but also on its lower surface. In this separating apparatus, separation processing is executed while supporting the bonded substrate stack 50 without bringing a support member and the like into contact with the surface of the bonded substrate stack 50 on the second substrate 20 side. That is, in this separating apparatus, separation processing is executed in a state wherein a space where no support section or support unit or another unit is present on the surface of the bonded substrate stack 50 on the second substrate 20 side is ensured, i.e., in a state wherein that surface is exposed to the atmosphere and other ambient environment.

A transfer apparatus for transferring the bonded substrate stack 50 to the separating apparatus also preferably supports the bonded substrate stack 50 without coming into contact with the surface of the bonded substrate stack 50 on the second substrate 20 side. This separating apparatus separates the bonded substrate stack 50 while horizontally supporting it such that the second substrate 20 side of the bonded substrate stack 50 is on the upper side. For this reason, the transfer apparatus preferably transfers the bonded substrate stack 50 to the separating apparatus while horizontally supporting the bonded substrate stack 50 such that the second substrate 20 side is on the upper side. Hence, a transfer apparatus capable of transferring an object to be transferred in a non-contact state using, e.g., a Bernoulli chuck is preferable.

A separating apparatus according to the preferred embodiment of the present invention and a separating method using the apparatus will be described below with reference to FIGS. 2 to 6. FIGS. 2 to 5 are side views of the separating apparatus. FIG. 6 is a plan view of the separating apparatus.

A separating apparatus 100 according to the preferred embodiment of the present invention has an ejection section (nozzle) 120 which ejects a fluid (e.g., a liquid such as water or an etchant or a gas such as air, nitrogen, or argon) toward the separation layer (porous layer 12) of the horizontally held bonded substrate stack 50. The vertical and horizontal positions of the ejection section 120 are adjusted by a position adjustment mechanism 110.

In separation processing and processing (transfer from/to the transfer apparatus) before and after it, the bonded substrate stack 50 is handled while keeping its first substrate (seed substrate or seed wafer) 10 on the lower side and the second substrate (handle substrate or handle wafer) 20 on the upper side.

At the first stage of separation processing, the bonded substrate stack 50 is chucked and supported by a first substrate support section 101 that comes into contact with only the central portion (first region) of the lower surface of the bonded substrate stack 50, i.e., the surface on the first substrate 10 side. This chucking is done by, e.g., a vacuum chuck. At this first stage, while rotating the bonded substrate stack 50, its peripheral portion is separated at the portion of the separation layer by a fluid ejected from the ejection section 120 to the bonding interface or separation layer (porous layer 12). The separation force effectively acts especially when the fluid is injected into a recess portion on the side surface, which is formed by beveling upon bonding the two wafers. The first substrate support section 101 rotates upon receiving a rotating force generated by a motor 107 through a rotating shaft 103 and gears 104 and 106. The first substrate support section 101 is connected to the driving shaft of a cylinder (actuator) 105 through the rotating shaft 103 and gear 104 so as to be moved in the vertical direction by the cylinder 105. The rotating shaft 103 is axially supported by a table 109 through a bearing 108.

At the first stage of separation processing, the bonded substrate stack 50 is rotated by at least one revolution, and its peripheral portion is separated at the portion of the separation layer. The size of the support surface of the first substrate support section 101 is designed not to impede progress of separation of the bonded substrate stack 50 at the first stage of separation processing. Typically, the first substrate support section 101 has a size smaller than the unseparated porous layer region that remains after the first stage of separation processing (preferably such a size that the length from the boundary of the unseparated porous layer region to the peripheral edge of the first substrate support section has a predetermined value or more). This is because in the entire region of the bonded substrate stack 50, the region chucked by the first substrate support section 101 is limited in its deformation, and progress of separation is impeded.

Figure 2:
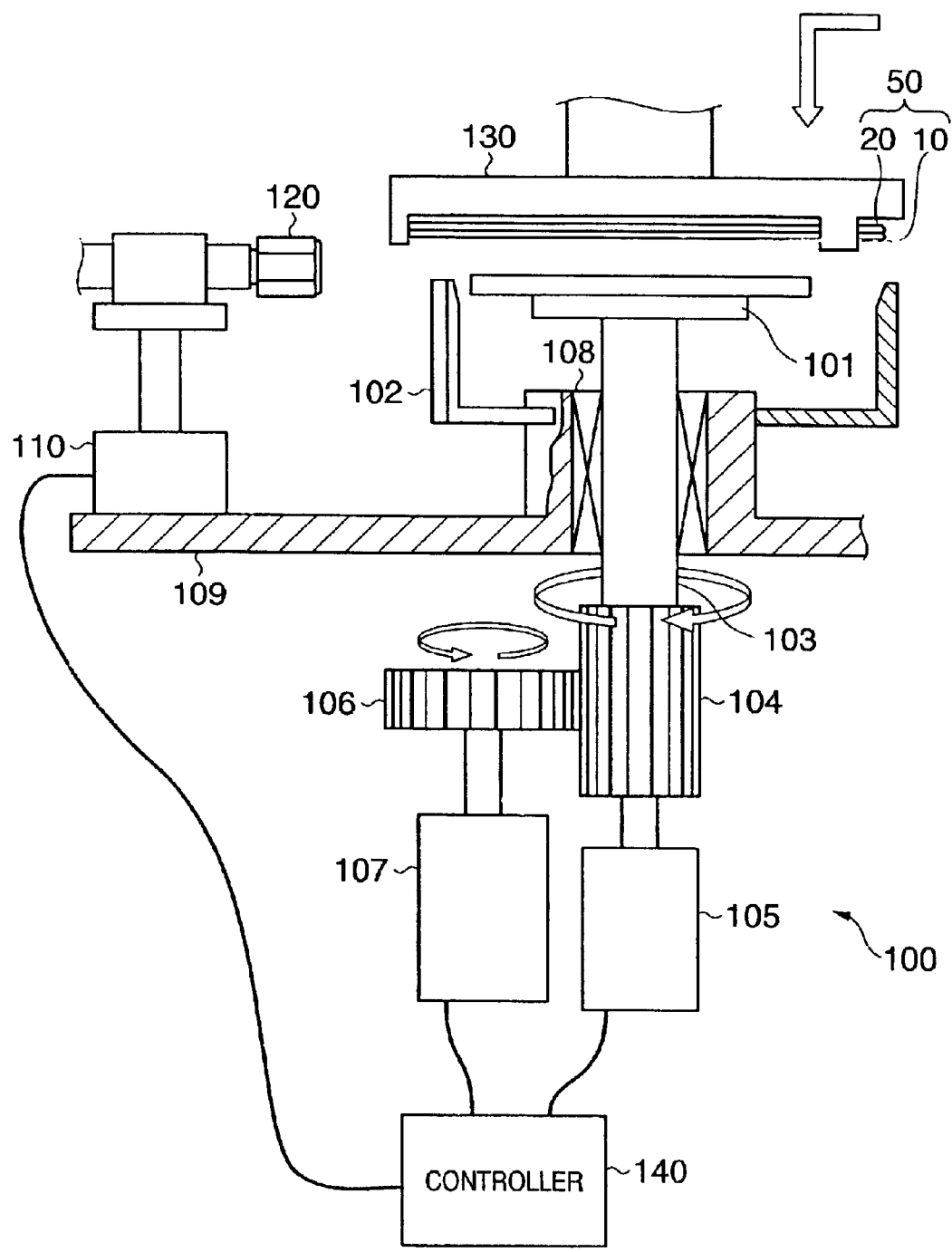
FIG. 2 is a side view showing a state wherein a bonded substrate stack is transferred to a separating apparatus.

FIG. 2 is a side view showing a state wherein the bonded substrate stack 50 is transferred to the separating apparatus 100. The bonded substrate stack 50 which is kept in the horizontal state with the first substrate 10 on the lower side and the second substrate 20 on the upper side is placed at a predetermined position of the first substrate support section 101 of the separating apparatus 100 by a transfer apparatus 130 having a chuck such as a Bernoulli chuck that supports an object to be transferred in a non-contact state. A Bernoulli chuck is described in, e.g., Japanese Patent Laid-Open No. 9-181026. At this time, the first substrate support section 101 is adjusted to the receiving position of the bonded substrate stack 50 by the cylinder 10 controlled by a controller 140. At this position, a second substrate support section 102 does not come into contact with the bonded substrate stack 50 supported by the first substrate support section 101. The first substrate support section 101 having a chuck such as a vacuum chuck chucks and supports the central portion of the lower surface (the surface on the first substrate 10 side) of the bonded substrate stack 50 in accordance with a command from the controller 140.

Figure 3:
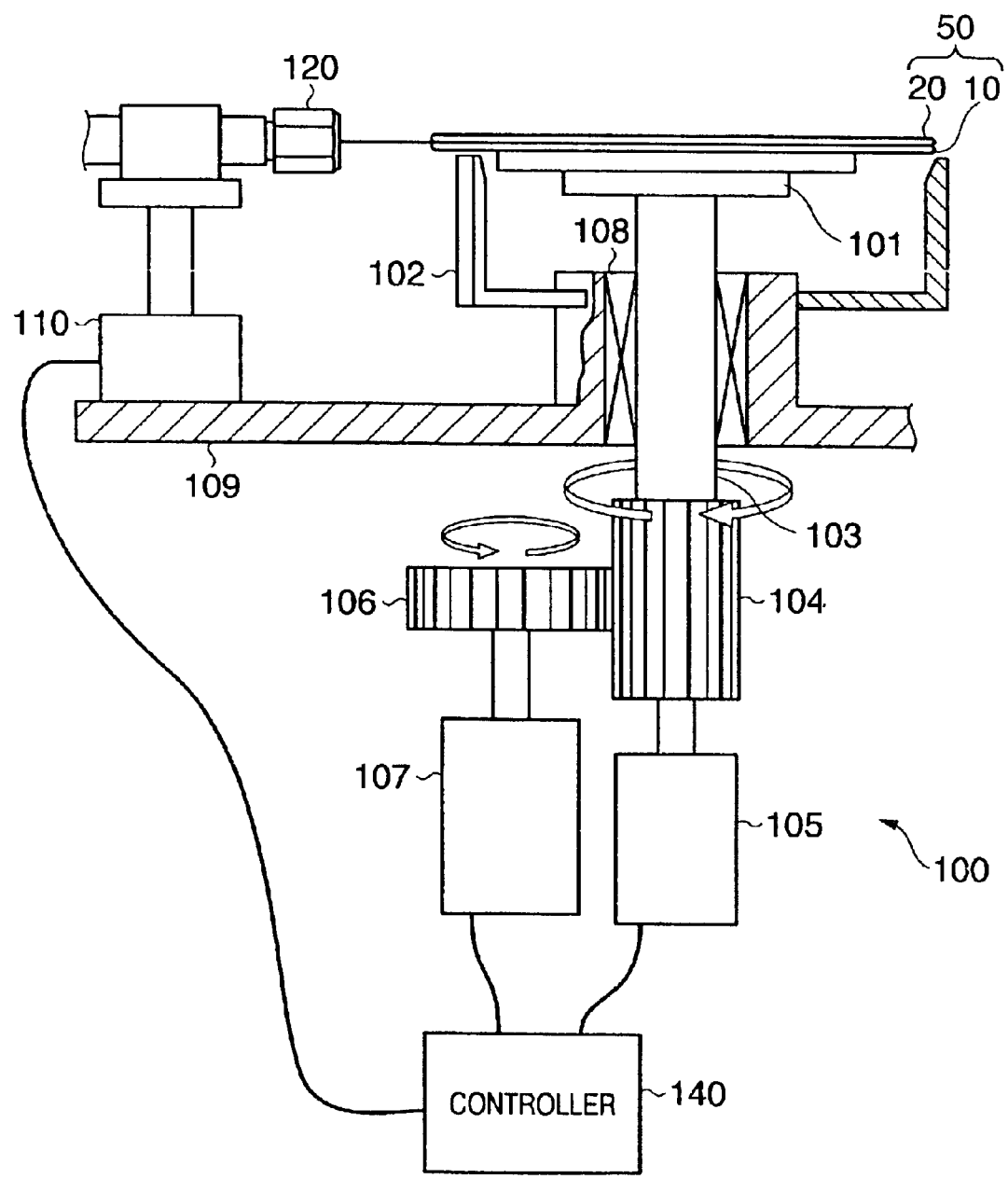
FIG. 3 is a side view showing the first stage of separation processing in the separating apparatus.

FIG. 3 is a side view showing the first stage of separation processing in the separating apparatus 100. At the first stage of separation processing, the position of the ejection section 120 is adjusted by the position adjustment mechanism 110 controlled by the controller 140 such that the fluid is ejected from the ejection section 120 into the separation layer (porous layer) of the bonded substrate stack 50 supported by the first substrate support section 101. Next, under the control by the controller 140, the fluid is ejected from the ejection section 120. Simultaneously, the peripheral portion of the bonded substrate stack 50 is separated at the porous layer functioning as a separation layer while rotating the bonded substrate stack 50 (first substrate support section 101) by the cylinder 105. When the first stage of separation processing is ended, fluid ejection from the ejection section 120 may be stopped. Alternatively, the fluid may be continuously ejected.

Figure 4:
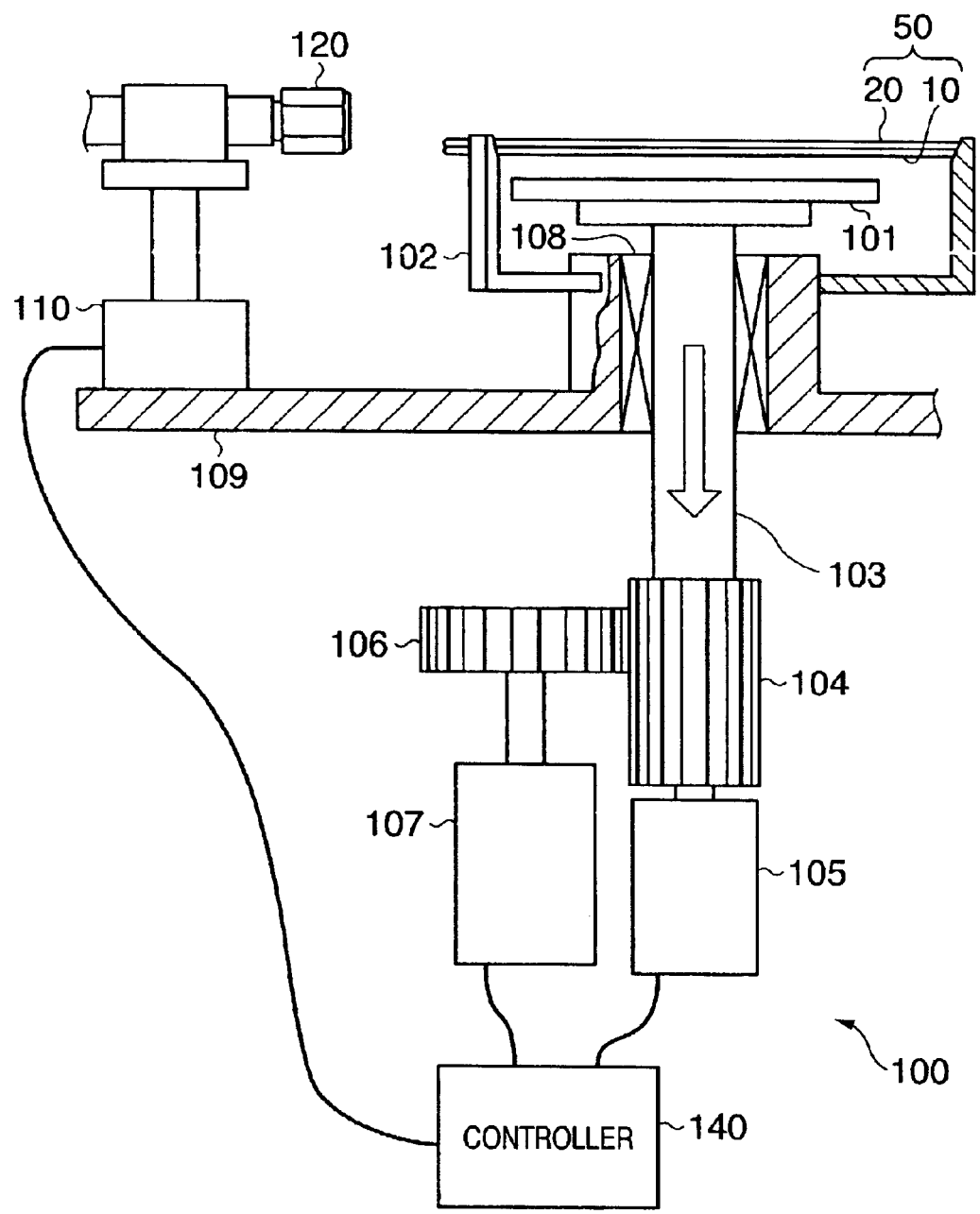
FIG. 4 is a side view showing a state wherein the bonded substrate stack is transferred from the first substrate support section to the second substrate support section.

When the first stage of separation processing is ended, under the control by the controller 140, the bonded substrate stack 50 (first substrate support section 101) is moved downward by the cylinder 105, thereby making the second substrate support section 102 support the bonded substrate stack 50 supported by the first substrate support section 101, as shown in FIG. 4.

The second substrate support section 102 comes into contact with only a region (second region) except the central portion of the lower surface of the bonded substrate stack 50 and the upper surface of the bonded substrate stack to horizontally support the bonded substrate stack 50 while regulating the horizontal position of the bonded substrate stack 50. The second region may be the beveling portion of the bonded substrate stack 50 or the lower peripheral portion and side surface of the bonded substrate stack 50.

In this embodiment, the bonded substrate stack 50 is transferred from the first substrate support section 101 to the second substrate support section 102 by moving the first substrate support section 101. Conversely, the bonded substrate stack 50 may be transferred from the first substrate support section 101 to the second substrate support section 102 by moving the second substrate support section 102. The bonded substrate stack 50 may be transferred from the first substrate support section 101 to the second substrate support section 102 by moving both the first substrate support section 101 and the second substrate support section 102. Alternatively, the bonded substrate stack 50 may be moved from the first substrate support section 101 to the second substrate support section 102 using another apparatus (e.g., a chuck apparatus or transfer apparatus).

Figure 5:
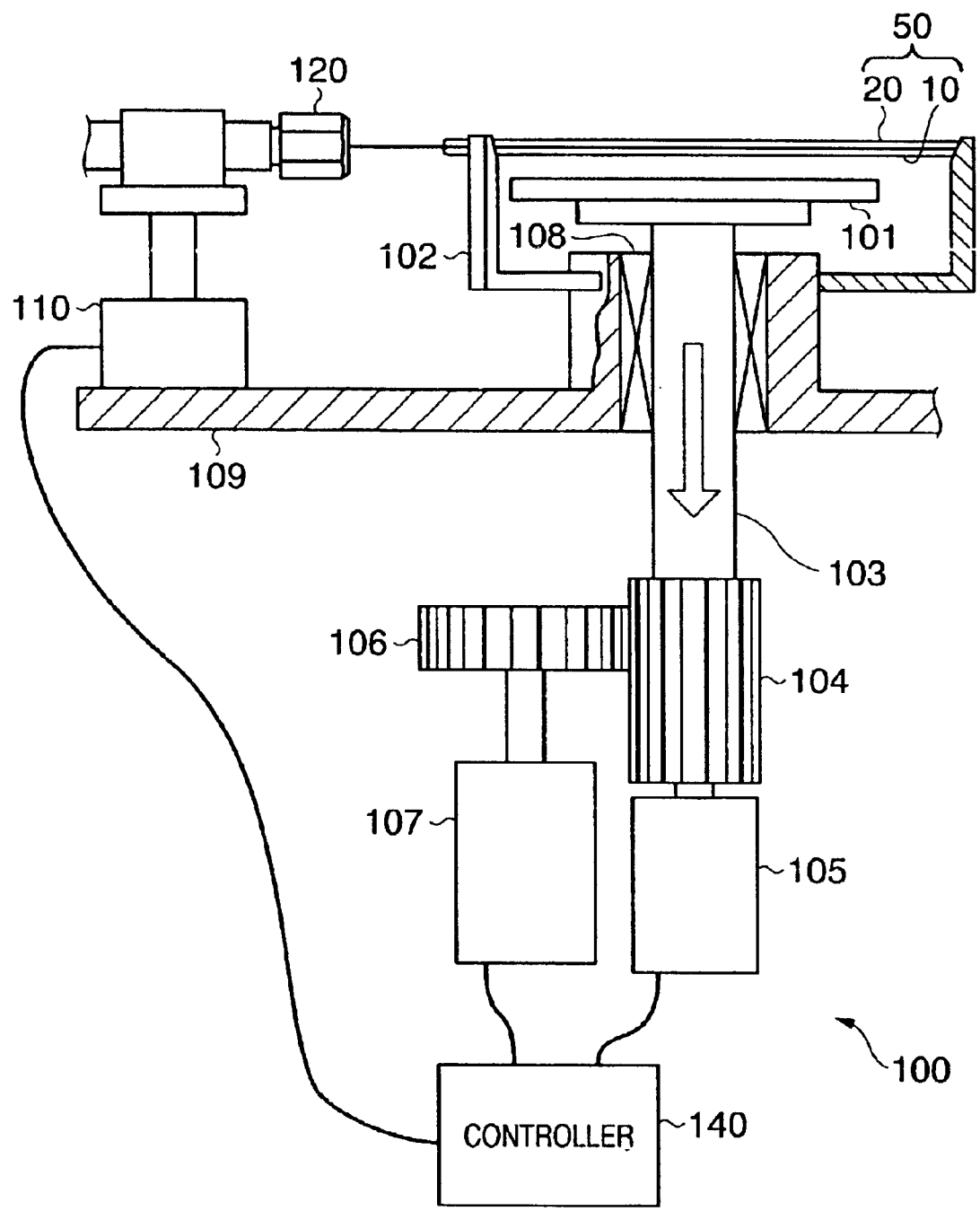
FIG. 5 is a side view showing the second stage of separation processing in the separating apparatus.
Figure 6:
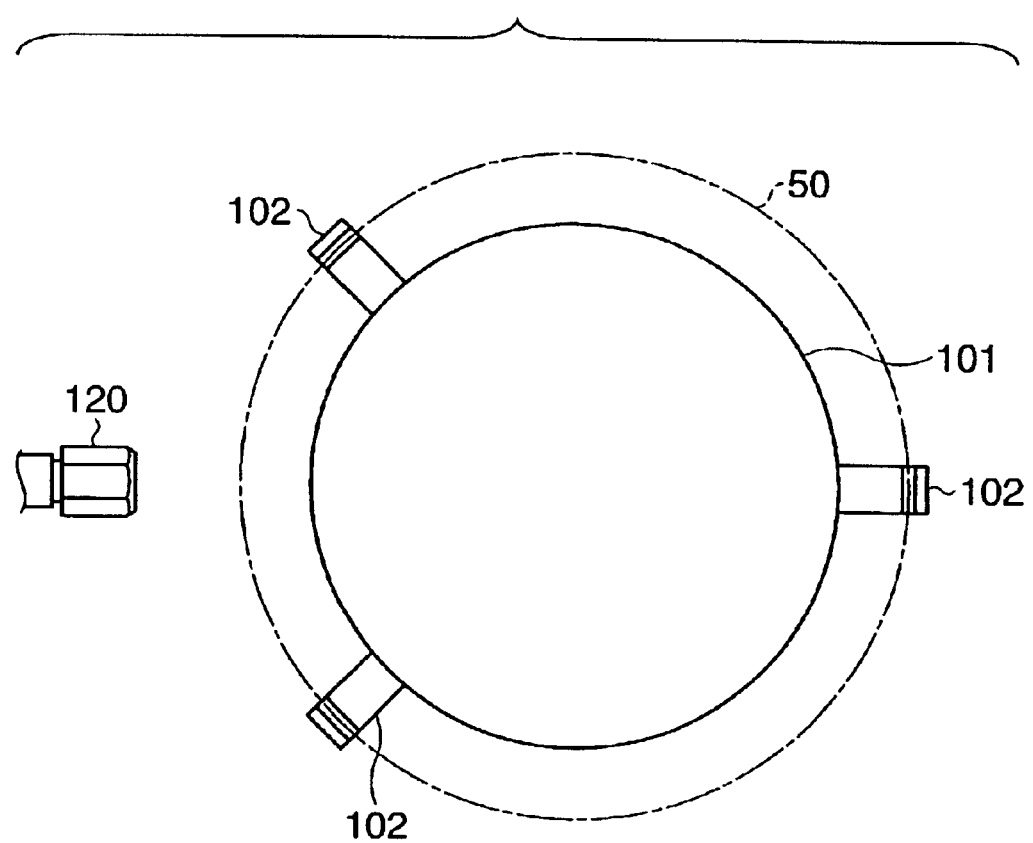
FIG. 6 is a plan view showing the separating apparatus.

FIG. 5 is a side view showing the second stage of separation processing in the separating apparatus 100. After the bonded substrate stack 50 is supported by the second substrate support section 102, the position of the ejection section 120 is adjusted by the position adjustment mechanism 110 controlled by the controller 140 such that the fluid is ejected from the ejection section 120 is injected into the separation layer (porous layer) of the bonded substrate stack 50 supported by the second substrate support section 102, as shown in FIG. 5. When fluid ejection from the ejection section 120 has been stopped at the end of the first stage of separation processing, the fluid must be ejected from the ejection section 120 again. At the second stage, separation of the porous layer at the central portion of the bonded substrate stack 50, i.e., the porous layer portion in the unseparated region progresses. Finally, the bonded substrate stack 50 is completely separated into two substrates at the porous layer.

Figure 8:
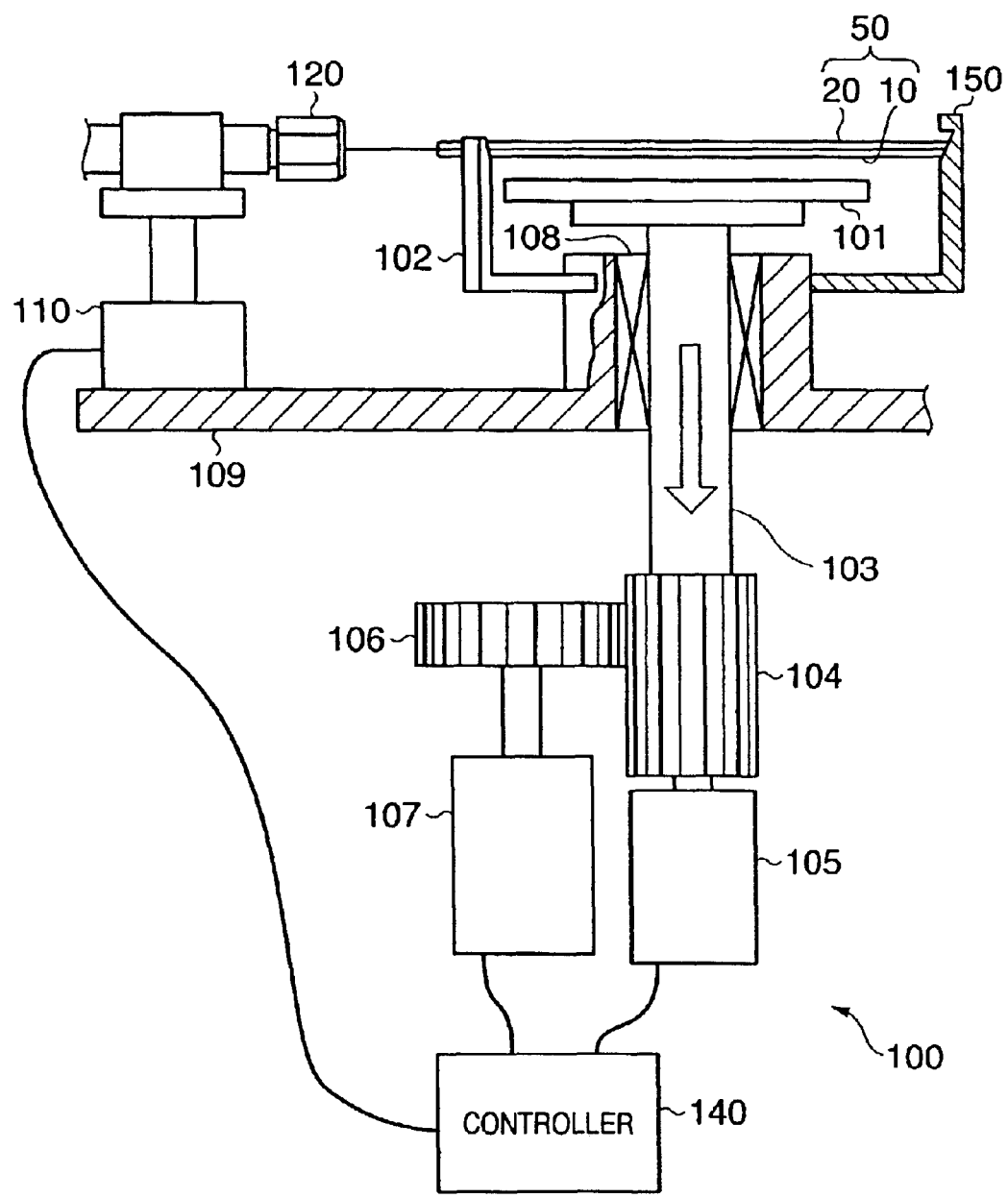
FIG. 8 is a side view showing a modification of the second substrate support section.

The horizontal position of the bonded substrate stack 50 is regulated by the second substrate support section 102. Hence, even after the bonded substrate stack is separated into two substrates, the substrate on the upper side is prevented from being blown off by the fluid and dropping. To prevent blow-off of the wafer, a blow-off preventing section 150 that does not come into contact with the upper surface of the second substrate may be arranged, as shown in FIG. 8.

In this embodiment, at the second stage of separation processing, the bonded substrate stack 50 is supported without rotating it. However, the bonded substrate stack may be supported while rotating it.

After the bonded substrate stack 50 is completely separated into two substrates, each separated substrate is transferred to another apparatus or a wafer cassette by the transfer apparatus. The upper substrate is preferably transferred by the transfer apparatus 130 having a chuck such as a Bernoulli chuck that supports an object to be transferred in a non-contact state. As described above, the upper substrate serves an SOI substrate after predetermined processing. For the lower substrate, e.g., a robot hand or the like is inserted between the lower substrate and the first substrate support section 101, chucked by the robot hand, and transferred to another apparatus or a wafer cassette.

According to this embodiment, the bonded substrate stack 50 is supported such that, of the upper and lower surfaces, the surface corresponding to the later lower surface of the SOI substrate (the lower surface of the second substrate, i.e., handle substrate) faces up. In addition, the bonded substrate stack is separated in a state wherein a space is ensured on the upper surface of the bonded substrate stack 50, i.e., in a state wherein no support section or support unit or another unit is in contact with the upper surface of the bonded substrate stack 50, i.e., that surface is exposed to the atmosphere and other ambient environment. For this reason, any damage on the surface corresponding to the later lower surface of the SOI substrate can be effectively prevented.

Additionally, according to this embodiment, at the first stage of the separation processing, the bonded substrate stack 50 is supported by the first substrate support section that comes into contact with only the central portion (first region) of the lower surface (the first substrate 10, i.e., the lower surface of the seed substrate) of the bonded substrate stack 50. At the second stage of separation processing, the bonded substrate stack 50 is supported by the second substrate support section which comes into contact with only a region (second region) except the central portion of the lower surface (the first substrate 10, i.e., the lower surface of the seed substrate) of the bonded substrate stack 50 and the upper surface of the bonded substrate stack while regulating the horizontal position of the bonded substrate stack 50. Hence, progress of separation processing is not undesirably impeded by the substrate support sections that support the bonded substrate stack 50. As a result, separation processing efficiently progresses.

Furthermore, according to this embodiment, the bonded substrate stack 50 is handled in the horizontal state. Hence, in separation processing and processing before and after it, the bonded substrate stack or separated substrate can be prevented from dropping. In addition, matching with another apparatus (a substrate is normally transferred and processed in the horizontal state) is good. The bonded substrate stack may be separated while supporting the second substrate surface in a non-contact state by a Bernoulli chuck capable of non-contact support from the first stage or second stage of separation processing.

Example of Semiconductor Device

A semiconductor device using a semiconductor substrate that can be manufactured by the above substrate manufacturing method (FIGS. 1A to 1E) and a method of manufacturing the same will be described next with reference to FIGS. 7A to 7D.

FIGS. 7A to 7D are sectional views showing a method of manufacturing a semiconductor device using a semiconductor substrate that can be manufactured by the substrate manufacturing method according to the preferred embodiment of the present invention.

First, an SOI substrate having a semiconductor layer as the non-porous layer 13 and an insulating layer as the non-porous layer 14 is manufactured using the above substrate manufacturing method. An active region 13' where a transistor should be formed and an element isolation region 54 are formed by a method of patterning the non-porous semiconductor layer (SOI layer) 13 on the buried insulating layer 14 into an island shape or an oxidation method called LOCOS (FIG. 7A).

A gate insulating film 56 is formed on the surface of the SOI layer (FIG. 7A). As the material of the gate insulating film 56, e.g., silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, or a glass mixture thereof is preferably used. The gate insulating film 56 can be formed by, e.g., oxidizing the surface of the SOT layer or depositing a corresponding material on the surface of the SOI layer by CVD or PVD.

A gate electrode 55 is formed on the gate insulating film 56 (FIG. 7A). The gate electrode 55 can be formed from, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate insulating film 56 may be formed by stacking a plurality of layers made of different materials, like, e.g., a polycide gate.

The gate electrode 55 may be formed by, e.g., a method called salicide (self-align silicide), a method called a damascene gate process, or another method. With this process, the structure shown in FIG. 7A is obtained.

Next, an n-type impurity such as phosphorus, arsenic, or antimony or a p-type impurity such as boron is doped into the active region 13' to form source and drain regions 58 which have a relatively low concentration (FIG. 7B). The impurity can be doped by, e.g., ion implantation and annealing.

An insulating film is formed to cover the gate electrode 55 and etched back to form a side wall 59 on the side surface of the gate electrode 55.

An impurity having the same conductivity type as described above is doped again into the active region 13' to form source and drain regions 57 which have a relatively high concentration. With this process, the structure shown in FIG. 7B is obtained.

A metal silicide layer 60 is formed on the upper surface of the gate electrode 55 and the upper surfaces of the source and drain regions 57. As the material of the metal silicide layer 60, e.g., nickel silicide, titanium silicide, cobalt silicide, molybdenum silicide, or tungsten silicide is preferably used. Such a silicide can be formed by depositing a metal to cover the upper surface of the gate electrode 55 and the upper surfaces of the source and drain regions 57, annealing and causing the metal to react with silicon in the underlying portion, and then removing an unreacted portion of the metal using an etchant such as sulfuric acid. The surface of the silicide layer may be nitrided, as needed. With this process, the structure shown in FIG. 7C is obtained.

An insulating film 61 is formed to cover the upper surface of the gate electrode and the upper surfaces of the source and drain regions, which are converted into a silicide (FIG. 7D). As the material of the insulating film 61, silicon oxide containing phosphorus and/or boron is preferably used.

Contact holes are formed in the insulating film 61, as needed. When photolithography using a KrF excimer laser, ArF excimer laser, $F_2$ excimer laser, electron beam, or X-rays is used, a rectangular contact hole with a side shorter than 0.25 $\mu$m or a circular contact hole with a diameter smaller than 0.25 $\mu$m can be formed.

The contact holes are filled with a conductive material. To fill the contact holes with a conductive material, preferably, a film consisting of a refractory metal or a nitride thereof is formed on the inner surface of each contact hole as a barrier metal 62, and then, a conductive material 63 such as a tungsten alloy, aluminum, an aluminum alloy, copper, or a copper alloy is deposited using CVD, PVD, or plating. The conductive material deposited higher than the upper surface of the insulating film 61 may be removed by etch-back or CMP. Before filling the conductive material, the surface of the silicide layer in each of the source and drain regions exposed to the bottom portions of the contact holes may be nitrided. With this process, a transistor such as a FET can be formed on the SOI layer, and a semiconductor device having a transistor with the structure shown in FIG. 7D is obtained.

When the thickness and impurity concentration of the active layer (SOI layer) 10' are determined such that a depletion layer that spreads under the gate insulating film when a voltage is applied to the gate electrode reaches the upper surface of the buried insulating film 14, the resultant transistor operates as a fully depleted transistor. When the thickness and impurity concentration of the active layer (SOI layer) 10' are determined such that the depletion layer does not reach the upper surface of the buried oxide film 14, the resultant transistor operates as a partially depleted transistor.

According to the present invention, a plate member such as a bonded substrate stack can be supported in a horizontal state without any contact with one surface of the member. In addition, separation can be efficiently progressed.

As many apparently widely different embodiments of the present invention can be made without departing from the spirit and scope thereof, it is to be understood that the invention is not limited to the specific embodiments thereof except as defined in the appended claims.

What is claimed is:

1. A separating apparatus for separating a plate member having a separation layer at the separation layer while horizontally supporting the plate member, the apparatus comprising:
   (i) an ejection section which ejects a fluid toward a recess portion on an outer side of the plate member so as to separate the plate member at the separation layer;
   (ii) a first support section which comes into contact with a first region that is a central portion of a lower surface of the plate member to support the plate member without coming into contact with an upper surface of the plate member;
   (iii) a second support section which comes into contact with only a second region of the plate member except the central portion of the lower surface of the plate member and the upper surface of the plate member to support the plate member while regulating a horizontal position of the plate member;
   (iv) a driving mechanism which moves at least one of said first support section and said second support section, and
   (v) a control section which causes said first support section to support the plate member at a first stage of separation processing of the plate member and causes said second support section to support the plate member at a second stage of the separation processing,
   wherein the separation processing is executed in a state in which a space is ensured on the upper surface of the plate member and at transition from the first stage to the second stage of the separation processing, said control section causes said driving mechanism to operate such that said second support section supports the plate member and said first support section does not support the plate member.

2. The apparatus according to claim 1, wherein the second region is an edge portion of the plate member.

3. The apparatus according to claim 1, wherein the state in which the space is ensured on the upper surface of the plate member is a state in which the upper surface of the plate member is not in contact with any support member.

4. The apparatus according to claim 1, further comprising a rotating mechanism which rotates the plate member in a horizontal plane by rotating said first support section.

5. The apparatus according to claim 4, wherein said second support section supports the plate member in a stationary state.

6. The apparatus according to claim 1, further comprising a position adjustment mechanism which adjusts a position of said ejection section so that the fluid ejected from said ejection section is injected into the separation layer of the plate member.

7. The apparatus according to claim 1, wherein the plate member has a disk shape.

8. The apparatus according to claim 1, wherein the separation layer is formed by anodizing or ion implantation.

9. A separating method of separating a bonded substrate stack, formed by bonding a seed substrate having a separation layer and a transfer layer on the separation layer to a handle substrate, into two substrates at the separation layer, wherein said first support section of the separating apparatus of claim 1 is caused to support the bonded substrate stack while keeping the handle substrate on an upper side, and the bonded substrate stack is separated into two substrates at the portion of the separation layer by the separating apparatus.

10. A separating method of separating a plate member having a separation layer at the separation layer by injecting a fluid into the separation layer while horizontally supporting the plate member, the method comprising:

the first step of, in a state in which a space is ensured on an upper surface of the plate member having a recess portion on an outer side, supporting the plate member by a first support section and separating a peripheral portion of the plate member at a portion of the separation layer with the fluid while the first support section comes into contact with a first region that is a central portion of a lower surface of the plate member and without coming into contact with the upper surface of the plate member; and the second step of, in the state in which the space is ensured on the upper surface of the plate member, supporting the plate member partially separated in the first step by a second support section and separating a central portion of the plate member at the separation layer with the fluid while the second support section comes into contact with only a second region of the plate member except the central portion of the lower surface of the plate member and the upper surface of the plate member, and regulating a horizontal position of the plate member.

11. The method according to claim 10, wherein the second region is an edge portion of the plate member.

12. The method according to claim 10, wherein the state in which the space is ensured on the upper surface of the plate member is a state in which the upper surface of the plate member is not in contact with any support member.

13. The method according to claim 10, wherein the first step is performed while rotating the plate member in a horizontal plane.

14. The method according to claim 13, wherein the second step is performed while supporting the plate member in a stationary state.

15. The method according to claim 10, wherein the plate member has a disk shape.

16. The method according to claim 10, wherein the separation layer is formed by anodizing or ion implantation.

17. The method according to claim 10, wherein the plate member is a bonded substrate stack generated by bonding a seed substrate having a separation layer and a transfer layer on the separation layer to a handle substrate, and in the first and second steps, the bonded substrate stack is supported while keeping the handle substrate on an upper side.

18. A semiconductor substrate manufacturing method comprising the steps of:

generating a bonded substrate stack as a plate member by bonding a seed substrate having a separation layer and a transfer layer on the separation layer to a handle substrate; and in a state in which the bonded substrate stack is horizontally supported while keeping the handle substrate on the upper side, separating the bonded substrate stack into two substrates at a portion of the separation layer by applying the separating method of claim 10.

19. A semiconductor device manufacturing method comprising the steps of:

preparing an SOI substrate manufactured by applying the manufacturing method of claim 18; and isolating an SOI layer of the SOI substrate and forming a transistor on the isolated SOI layer.

* * * * *

UNITED STATES PATENT AND TRADEMARK OFFICE
CERTIFICATE OF CORRECTION

PATENT NO. : 6,833,312 B2
DATED : December 21, 2004
INVENTOR(S) : Kazutaka Yanagita et al.

It is certified that error appears in the above-identified patent and that said Letters Patent is hereby corrected as shown below:

Title page,
Item [56], References Cited, U.S. PATENT DOCUMENTS, delete "3,549,466 A 12/1970 Kay et al. 161/39" "6,672,031 B2 1/2004" should read -- 6,672,658 B2 1/2004 --; FOREIGN PATENT DOCUMENTS, "JP 5-211128 9/1992" should read -- JP04-211128 --; "JP 2000,77286 2/1998" should read JP 2000-77286 2/2000 and "WO WO 01/-10644" should read -- WO WO 01/10644 --
OTHER PUBLICATIONS, "Light Scattering Topagraphy Charachterization of Bonded SOI Wafer" reference, "Charachterization" should read -- Characterization --, and "Baumgart t al.," should read -- Baumgart et al., --, "Charles E. Hunt et al.," reference, "Expitaxial" should read -- Epitaxial --, "Oxidized Porous Silcon and It's Application," "Hunt t al.," should read -- Hunt et al., --.

Column 1,
Line 46, "SOT" should read -- SOI --.

Column 8,
Line 52, "serves" should read -- serves as --.

Column 10,
Line 19, "cylinder 10" should read -- cylinder 105 --; and
Line 55, "stack" should read -- stack 50 --.

Column 11,
Line 29, "stack" should read -- stack 50 --.

Column 12,
Line 55, "SOT" should read -- SOI --.

UNITED STATES PATENT AND TRADEMARK OFFICE
CERTIFICATE OF CORRECTION

PATENT NO.    : 6,833,312 B2
DATED         : December 21, 2004
INVENTOR(S)   : Kazutaka Yanagita et al.

It is certified that error appears in the above-identified patent and that said Letters Patent is hereby corrected as shown below:

<u>Column 13,</u>
Line 6, "regions 58" should read -- regions 57 and 58 --;
Lines 15, 20 and 25 "regions 57" should read -- regions 57 and 58 --;
Line 32, "electrode" should read -- electrode 55 --;
Line 33, "regions," should read -- regions 57, --;
Line 51, "material," should read -- material 63, --;
Line 52, "layer" should read -- layer 60 --; and
Line 59, "film" should read -- film 61 --.

Signed and Sealed this

Seventh Day of June, 2005

JON W. DUDAS
*Director of the United States Patent and Trademark Office*

UNITED STATES PATENT AND TRADEMARK OFFICE
CERTIFICATE OF CORRECTION

PATENT NO. : 6,833,312 B2
DATED : December 21, 2004
INVENTOR(S) : Kazutaka Yanagita et al.

It is certified that error appears in the above-identified patent and that said Letters Patent is hereby corrected as shown below:

Title page,
Item [56], References Cited, U.S. PATENT DOCUMENTS, delete "3,549,466 A 12/1970 Kay et al. 161/39" "6,672,031 B2 1/2004" should read -- 6,672,658 B2 1/2004 --; FOREIGN PATENT DOCUMENTS, "JP 5-211128 9/1992" should read -- JP05-211128 8/1993 --; "JP 2000,77286 2/1998" should read -- JP 2000-77286 3/2000 --; and "WO WO 01/-10644" should read -- WO WO 01/10644 --
OTHER PUBLICATIONS, "Light Scattering Topagraphy Charachterization of Bonded SOI Wafer" reference, "Charachterization" should read -- Characterization --, and "Baumgart t al.," should read -- Baumgart et al., --, "Charles E. Hunt et al.," reference, "Expitaxial" should read -- Epitaxial --, "Oxidized Porous Silcon and It's Application," "Hunt t al.," should read -- Hunt et al., --.

Column 1,
Line 46, "SOT" should read -- SOI --.

Column 8,
Line 52, "serves" should read -- serves as --.

Column 10,
Line 19, "cylinder 10" should read -- cylinder 105 --; and
Line 55, "stack" should read -- stack 50 --.

Column 11,
Line 29, "stack" should read -- stack 50 --.

Column 12,
Line 55, "SOT" should read -- SOI --.

UNITED STATES PATENT AND TRADEMARK OFFICE
CERTIFICATE OF CORRECTION

PATENT NO.   : 6,833,312 B2
DATED        : December 21, 2004
INVENTOR(S)  : Kazutaka Yanagita et al.

It is certified that error appears in the above-identified patent and that said Letters Patent is hereby corrected as shown below:

<u>Column 13,</u>
Line 6, "regions 58" should read -- regions 57 and 58 --;
Lines 15, 20 and 25 "regions 57" should read -- regions 57 and 58 --;
Line 32, "electrode" should read -- electrode 55 --;
Line 33, "regions," should read -- regions 57, --;
Line 51, "material," should read -- material 63, --;
Line 52, "layer" should read -- layer 60 --; and
Line 59, "film" should read -- film 61 --.

This certificate supersedes Certificate of Correction issued July 7, 2005.

Signed and Sealed this

Sixth Day of September, 2005

JON W. DUDAS
*Director of the United States Patent and Trademark Office*